United States Patent [19]

Taylor et al.

[11] Patent Number: 5,329,113
[45] Date of Patent: Jul. 12, 1994

[54] OPTOELECTRONIC SWITCHING NODE

[75] Inventors: Geoffrey W. Taylor, Holmdel; Timothy A. Vang, Tinton Falls, both of N.J.

[73] Assignee: AT&T Bell Laboratories, Murray Hill, N.J.

[21] Appl. No.: 75,087

[22] Filed: Jun. 10, 1993

[51] Int. Cl.$^5$ .............................................. H01J 40/14
[52] U.S. Cl. ............................. 250/214 LS; 250/551; 250/553; 307/311
[58] Field of Search ................. 250/551, 553, 214 LS; 307/311; 377/102

[56] References Cited

U.S. PATENT DOCUMENTS

| | | | |
|---|---|---|---|
| 4,369,371 | 1/1983 | Hara et al. | 250/551 |
| 4,689,793 | 8/1987 | Liu et al. | 250/214 LS |
| 4,800,415 | 1/1989 | Simmons et al. | 357/34 |
| 4,806,997 | 2/1989 | Simmons et al. | 357/16 |

OTHER PUBLICATIONS

"Optoelectronic Resonant Cavity Technology Based on Inversion Channel Devices" P. A. Evaldsson, et al., Optical and Quantum Electronics 24, Feb. 1992, pp. S133-S146.

"Photonic Switching Applications of 2-D and 3-D Crossover Networks Based on 2-input, 2-output Switching Nodes", T. J. Cloonan and F. B. McCormick Applied Optics, vol. 30, No. 17, Jun. 10, 1991, pp. 2309-2323.

"Operation of a Fully Integrated GaAs-Al$_x$Ga$_{1-x}$As FET-SEED: A Basic Optically Addressed Integrated Circuit", T. K. Woodward et al., IEEE Photonics Technology Letters, vol. 4, No. 6, Jun. 1992, pp. 614-617.

"Uniformity in the Performance Characteristics of an 8×8 Vertical to Surface Transmission Electro-Photonic Device Matrix".

Y. Tashiro, et al., Electronics Letters, vol. 26, No. 10 May 10, 1990, pp. 627-629.

"Integrated Inversion Channel Optoelectronic Devices and Circuit Elements for Multifunctional Array" G. W. Taylor, et al., IEEE Journal of Quantum Electronics, vol. 29, No. 2, Feb. 1993, pp. 785-800.

Primary Examiner—Edward P. Westin
Assistant Examiner—T. Davenport

[57] ABSTRACT

An optoelectronic switching node is disclosed wherein two input optical beams can be switched in the sense that they can be regenerated in either one of two output spatial locations in response to input control signals. Each one of the input optical beams is coupled to a resonant cavity detector which generates a current when its corresponding optical beam impinges on its resonant cavity. Output optical beams are regenerated by two inversion channel lasers each one of which has emitter, source and sub-collector terminals and is bistable in the sense that it can be switched on and off by currents delivered into and taken out of its source terminal. Heterojunction field effect transistors are used to selectively couple the currents generated by the resonant cavity detectors to the source terminals of the lasers in order to turn them on. Two heterojunction field effect transistors are each connected as a two terminal impedance between the source terminal of each laser and a reference potential in order to turn the laser off when no current is being provided by a detector. Two additional heterojunction field effect transistors are also connected as two terminal load impedances for each of the lasers. All of the devices are fabricated on a single wafer using a single epitaxial growth.

10 Claims, 3 Drawing Sheets

| LAYERS | LAYER NUMBER | LASER | | PHOTO-DETECTOR | | HFET | |
|---|---|---|---|---|---|---|---|
| GaAs p 2×10¹⁹ | 108 | EMITTER | | GATE | | GATE | |
| AlGaAs p 2×10¹⁸ | 60–107 | | TOP REFLECTOR | | TOP REFLECTOR | | |
| GaAs p 2×10¹⁸ | | | | | | | |
| AlGaAs p 2×10¹⁸ | | | | | | | |
| AlAs p 2×10¹⁸ | | | | | | | |
| AlGaAs p 5×10¹⁷ | 59 | | | | | | |
| AlGaAs p 1×10¹⁷ | 58 | | | | | | |
| AlGaAs n 6×10¹⁸ | 57 | | | | | | |
| InGaAs UNDOPED | 51–56 | SOURCE | ACTIVE REGION | CATHODE | ABSORPTION REGION | SOURCE DRAIN | |
| GaAs UNDOPED | | | | | | | |
| AlGaAs UNDOPED | 50 | | | | | | |
| AlGaAs p 5×10¹⁶ | 49 | | | | | | |
| AlGaAs p 1×10¹⁸ | 48 | | | | | | |
| AlGaAs p 2×10¹⁸ | 47 | | | | | | |
| AlAs n 2×10¹⁸ | 46 | | | ANODE | | COLLECTOR | |
| GaAs n 2×10¹⁸ | 34–45 | SUB-COLLECTOR | BOTTOM REFLECTOR | | BOTTOM REFLECTOR | | |
| AlAs n 2×10¹⁸ | | | | | | | |
| GaAs UNDOPED | 2–33 | | | | | | |
| AlAs UNDOPED | | | | | | | |
| SEMI-INSULATING GaAs | 1 | | | | | | |

X12: layers 60–107  
X3: layers 51–56  
X6: layers 34–45  
X16: layers 2–33

FIG. 4

OPTOELECTRONIC SWITCHING NODE

BACKGROUND OF THE INVENTION

1. Field of the Invention

This invention relates to optoelectronic circuits, and more particularly to optoelectronic circuits which are capable of regenerating an input optical beam at either one of two output spatial locations.

2. Description of the Related Art

It is well known that a switching node that is capable of accepting optical input beams from a previous stage and routing those optical beams to a succeeding switching node is a very desireable element in the construction of a switching network. See for example, the article entitled "Photonic Switching Applications of 2-D and 3-D Crossover Networks Based on 2-input, 2-output Switching Nodes", by Thomas J. Cloonan and Frederick B. McCormick, Applied Optics, vol. 30, no. 17, pages 2309-2323, June, 1991. As pointed out in the Cloonan et al article, the most commonly used node type in network design is probably the two by two cross-bar switch wherein two optical input beams are coupled through to either one of two optical outputs. In FIG. 10 of the article, two input optical beams are coupled through to either one of two optical outputs by passing the beams through three substrates containing self-electrooptic devices (SEEDs). The switching occurs as a result of the input optical beams interacting with a multiplicity of orthogonal optical control beams. This prior art switching node suffers from the fact that complicated optical hardware arrangements are required to couple the many orthogonal beams while maintaining critical alignment between the substrates used to implement a single node stage.

A useful optical element which has been recently described in the prior art is the vertical cavity double heterostructure optoelectronic switch (VC-DOES) laser. See the article entitled "Optoelectronic resonant cavity technology based on inversion channel devices", by P. A. Evaldsson, S. Daryanani, P. Cooke, and G. W. Taylor, Optical Quantum Electronics, vol. 24, pages S133-S146, February 1992. In the Evaldsson et al article a surface emitting three terminal laser is described wherein the operation of the laser is very sensitive to the voltage applied to its source contact which essentially acts as a gating electrode. An edge-emitting form of this laser is disclosed in U.S. Pat. No. 4,806,997 of Feb. 21, 1989 to John G. Simmons and Geoffrey W. Taylor. As pointed out in the Simmons et al patent, operation of the laser can be triggered by a photodetector of the same structure without any intervening amplification. See in particular FIG. 8 of the patent and the accompanying discussion.

An excellent discussion of inversion channel devices and how they can be combined to make circuit elements can be found in the article entitled "Integrated Inversion Channel Optoelectronic Devices and Circuit Elements for Multifunctional Array Applications", by G. W. Taylor et al, IEEE Journal of Quantum Electronics, Vol. 29, No. 2, pages 785-800, February 1993. In this article, we, the applicants, disclose in FIG. 29 an optoelectronic switch which is proposed as a replacement for the three substrate SEED switch disclosed in the above-cited Cloonan et al article. As pointed out in the article in the material which discusses FIG. 29, the proposed switch would solve the alignment problems inherent with the Cloonan et al switch. Unfortunately, we inadvertently disclosed an inoperative embodiment in FIG. 29 inasmuch as once the laser in that figure is turned on, it will remain on and therefore not properly reproduce the intensity variations in the input optical beam.

SUMMARY OF THE INVENTION

The critical alignment problems of the prior art switching nodes are eliminated in accordance with the present invention wherein bistable surface-emitting lasers, resonant cavity detectors, and heterostructure field effect transistors are all fabricated on a single wafer using a single epitaxial growth. The output of a resonant cavity detector is selectively coupled through a switched heterostructure field effect transistor to the source terminal of a surface-emitting laser which is fabricated using an inversion channel and therefore operates as a bistable device which can be switched on by a current delivered to its source terminal. A heterostructure field effect transistor is connected as a two terminal impedance between the source terminal and a potential source such that a portion of the current supplied by the detector is also coupled through the impedance. As a result, the impedance draws a current from the source terminal and the bistable laser is switched off during the periods when the detector is not supplying an output current.

A 2×2 switching node wherein two input optical beams can be switched to either one of two spatial locations represented by the position of two bistable surface-emitting lasers can be constructed in accordance with the present invention. The two input optical beams are each coupled to a resonant cavity detector, and the output current from each of the detectors is selectively coupled by way of switched heterostructure field effect transistors (HFET's) to the source terminal on either one of the two surface emitting lasers. The current from a resonant cavity detector into the source terminal of a laser causes the laser to be turned on. Each of the surface-emitting lasers has a HFET connected as a load impedance to limit the current flow during the periods when the bistable laser is switched on, and a second HFET connected as an impedance between the source terminal and a reference potential to bypass some of the current from the detector. As a result, the second HFET impedance draws current from the source terminal and causes the laser to be turned off when the detector is no longer supplying a current resulting from an input optical beam. The first and second impedances are advantageously fabricated by connecting together the gate and source terminals of a heterostructure field effect transistor (HFET) thereby providing a two terminal impedance between the source and drain terminals.

It is an aspect of the present invention that the bistable surface-emitting laser is fabricated as a vertical cavity double heterostructure optoelectronic (VC-DOES) laser using an inversion channel, and all of the other devices are fabricated by using some of the layers used to fabricate the laser. As a result, all of the devices can be fabricated on a single chip using a single epitaxial process, and the bistable laser is sensitive enough to currents provided at its source terminal such that the laser can be switched by the current provided by a single photodetector without any intervening amplification. Accordingly, the heterostructure field effect transistors (HFET) need only be used to selectively switch the current developed by the photodetector.

BRIEF DESCRIPTION OF THE DRAWING

FIG. 4 is a chart which is useful in explaining how to fabricate the devices used in the construction of the present invention.

DETAILED DESCRIPTION OF THE PREFERRED EMBODIMENT

Figure 1:
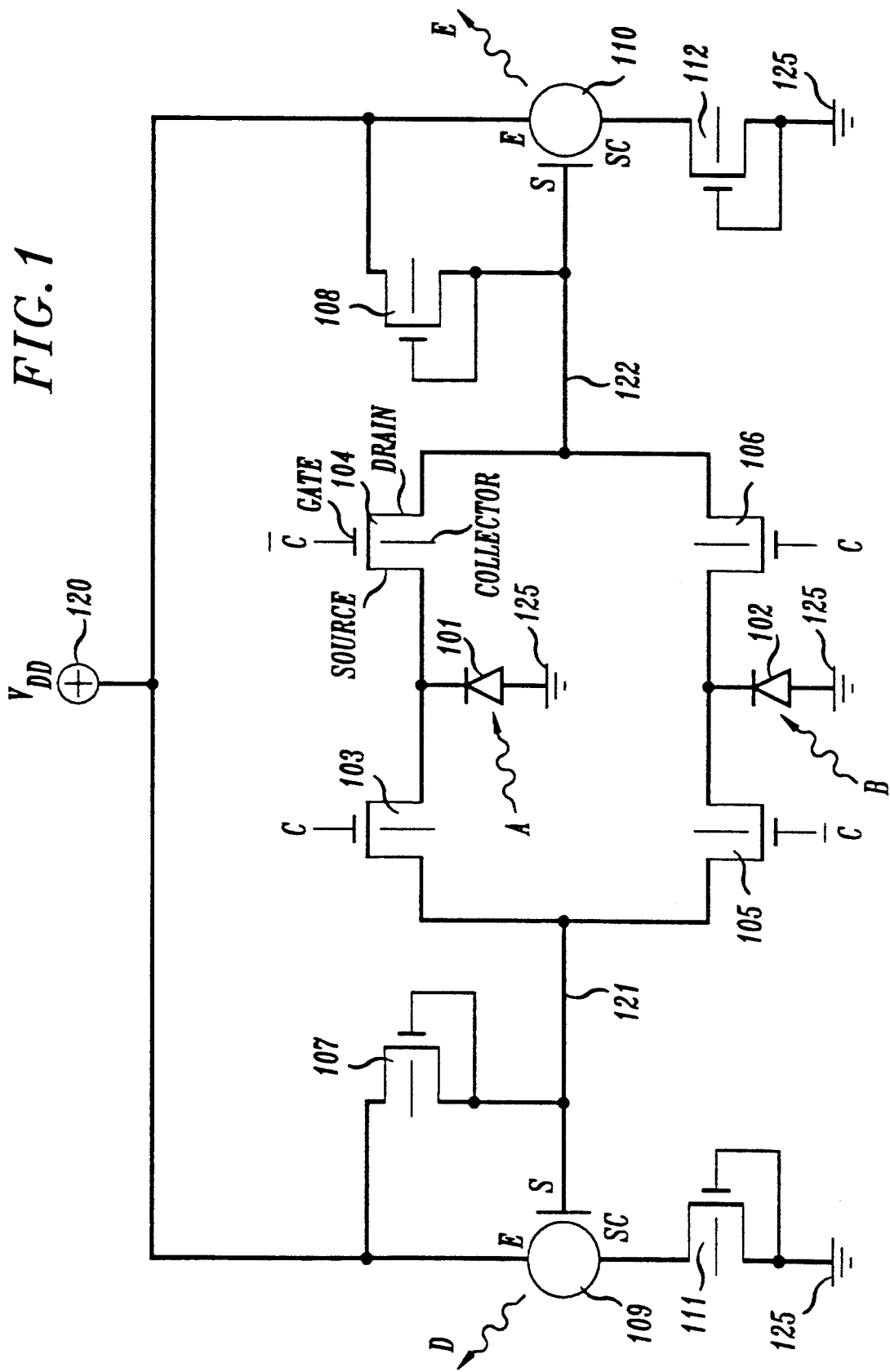
FIG. 1 is a schematic diagram of a two by two node constructed in accordance with the present invention.

FIG. 1 shows a specific embodiment of a 2×2 switch which can be implemented in a single wafer using inversion channel technology. Switching nodes have also been described in the prior art by using a triplet notation, (n,m,c) where n is the number of inputs, m is the number of outputs, and c is the capacity of the switch. In that notation the present embodiment is a (2,2,2) node. In FIG. 1, input optical beams A and B are oriented so as to impinge respectively on resonant cavity detectors 101 and 102. The anode of resonant cavity detector (RCD) 101 is connected to a reference potential 125 and its cathode is connected to the source terminals of heterojunction field effect transistors (HFET) 103 and 104. Similarly the anode of RCD 102 is connected to reference potential 125 and its cathode is connected to the source terminals of HFET's 105 and 106. The drain terminals of HFET's 103 and 105 are connected by way of line 121 to the source terminal of a surface-emitting laser (SEL) 109, and the drain terminals of HFET's 104 and 106 are similarly connected by way of line 122 to the source terminal of a surface-emitting laser 110. As shown, HFET's 103-106 are controlled by control signals C and its complement $\overline{C}$ which are connected to the gate terminals of the HFET's. When signal C is high, the current generated by RCD 101 is coupled through to the source terminal of SEL 109, and the current generated by RCD 102 is coupled through to the source terminal of SEL 110. During this period, the complementary signal, $\overline{C}$, drives the gates of HFET's 104 and 106 low such that the current from RCD 101 is blocked from SEL 110 and the current from RCD 102 is blocked from SEL 109. With C high and its complement, $\overline{C}$, low, the currents from the RCD's are routed to the opposite SEL's. Use of the control signal, C, and its complement prevents the generated photodetector currents from driving the same SEL. It should be apparent to those skilled in the art that use of signal C to drive HFET's 103 and 104 and its complementary signal, $\overline{C}$, to drive HFET's 105 and 106, would provide a circuit whereby either RCD could drive both of the SEL's 109 and 110 while preventing the other RCD from driving either SEL. It should also be apparent to those skilled in the art that the source and drain terminals for any given HFET can be interchanged when describing how the devices are connected in the circuit of FIG. 1.

Figure 3:
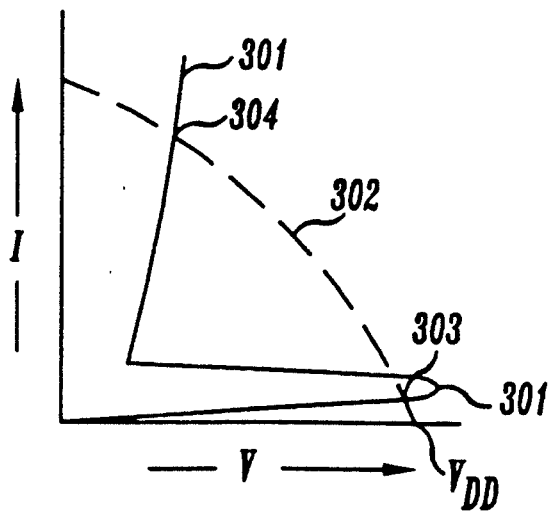
FIG. 3 is a graph of the voltage versus current present across one of the bistable surface-emitting lasers which graph is useful in explaining the operation of the present invention.

The gate of HFET 111 is connected to its source and to a reference potential 125. The drain of HFET 111 is connected to the sub-collector of SEL 109. With the emitter of SEL 109 connected to a potential source 120, $V_{DD}$, HFET 111 serves as load impedance for SEL 109. Similarly, HFET 112 serves as a load impedance for SEL 110 between the potential source 120 and reference potential 125. Operation of SEL's 109 and 110 can more easily described by referring to the graph shown in FIG. 3 wherein curve 301 shows the relationship between the current into the emitter of the SEL versus the voltage across the emitter and sub-collectors of the SEL. Dotted curve 302 shows the load line which is provided by the impedance of either HFET 111 or 112. As indicated by curve 302, the HFET provides a nonlinear impedance having greater resistance as the current is increased. With no current provided to the gate of the SEL, operation of the SEL will settle at a current and voltage corresponding to the intersection of curves 301 and 302 at point 303. If however, sufficient current is provided to the source terminal of the SEL, the SEL can be driven to the operating point represented by the intersection at point 304. By selection of the device parameters, the current represented by point 304 is caused to be in excess of the current at which the SEL exhibits lasing action.

Without any additional elements, the current provided by either of the RCD's will drive the selected SEL into lasing and the lasing would continue even after the RCD no longer provided current as when the corresponding input optical beam is no longer present. In accordance with the present invention, HFET 107 is connected as an impedance between the source terminal of SEL 109 and potential source 120. Here again as in the case of HFET's 111 and 112, the gate terminal of the HFET is connected to the source in order to provide an impedance between the source and drain terminals. Similarly, a HFET 108 is connected as an impedance between the source terminal of SEL 110 and potential source 120. Both HFET 107 and 108 provide electrical loads which divert some of the current from the RCD which is coupled towards the source terminal of the SEL. As a result, both HFET 107 and 108 provide a current path for the turn off of their corresponding SEL when the RCD is no longer providing current either by virtue of the fact that the input optical beam is no longer present or by virtue of the fact that the RCD has been disconnected by switching action of the control inputs C or $\overline{C}$.

Each of the HFET's in FIG. 1 is shown as having an external terminal for its collector region. Each of these collector terminals, although not shown as being connected, can be connected to a potential which will adjust the electrical threshold of the HFET. In many of the instances, this collector terminal can be simply connected to the source terminal of the HFET. A different potential can be used in order to correct for variations which might have occurred in the processing technique.

Figure 2:
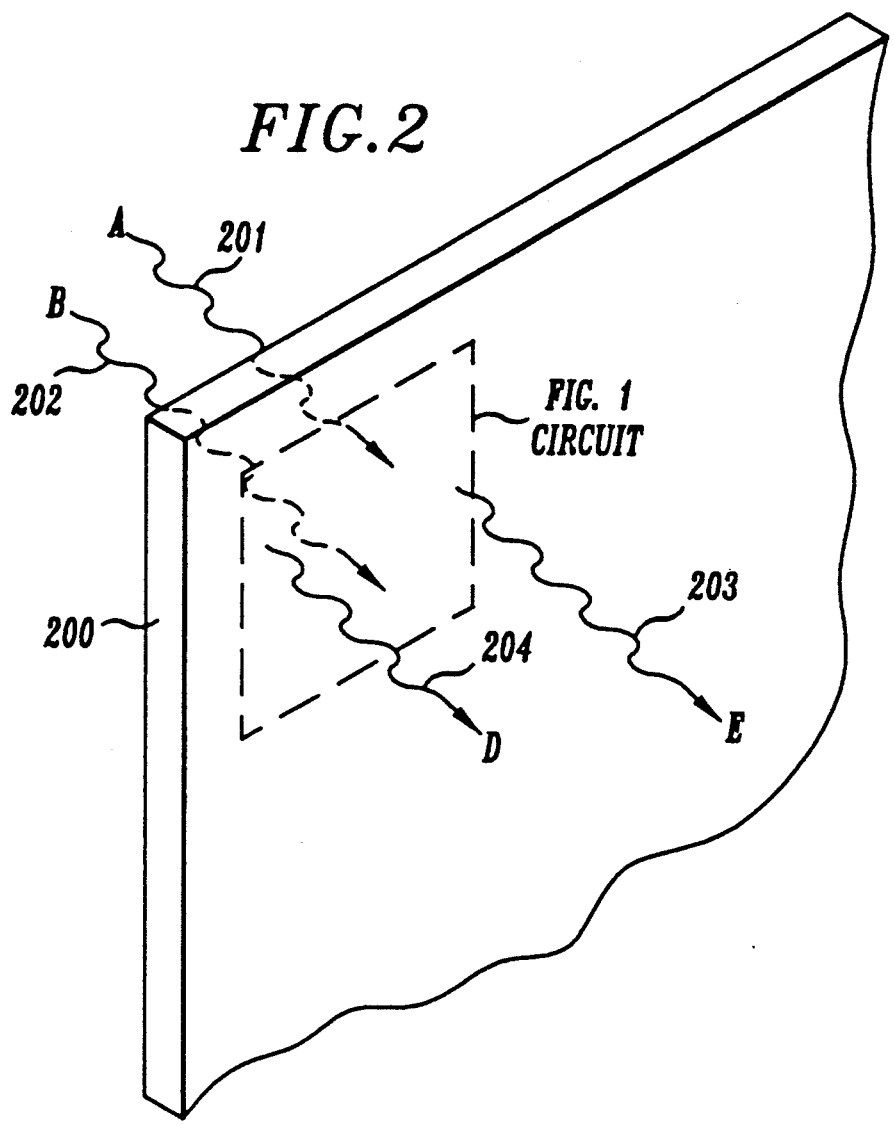
FIG. 2 is a perspective drawing of an epitaxial chip constructed in accordance with the present invention.

The circuit of FIG. 1 can be constructed in a manner to be described hereinbelow on a single wafer using a single epitaxial process. By using the strained InGaAs system, light can be produced which is transparent to the GaAs substrate, and therefor light can be coupled into one side of the wafer and emitted form the other side of the wafer. Accordingly, as shown in the perspective drawings of FIG. 2, hundreds of the circuits shown in FIG. 1 can be fabricated in an array on a single wafer 200, and input light beams such as 201 and 202 can be coupled into one side of the wafer and output light beams such as 203 and 204 will be generated at the other side of the wafer. It should be readily apparent to those skilled in the art that since FET's can be fabricated, many types of control circuitry can also be constructed on the single wafer to provide interconnection and control of the individual switching nodes. In addition, the high responsiveness of the resonant cavity detectors and the low switching energy required by the surface emitting lasers gives the potential for a fanout of the optical output by the use of binary phase gratings. By using an optical fanout of two, the circuit can easily be made into a (2,4,2) switching node.

The semiconductor processing technique which is used to fabricate the present invention on a single wafer is identical to the processing desribed in the article entitled "Optoelectronic resonant cavity technology based on inversion channel devices", by P. A. Evaldsson et al, Optical and Quantum Electronics, vol. 24, pages S133-S146, February 1992. That article describes how to make all three of the devices used in the present invention and the essential material of that article is included hereinbelow for the sake of completeness. As shown in FIG. 4, the devices are all grown on a semi-insulating GaAs substrate indicated as layer 1. The growth technique used is conventional molecular beam epitaxy (MBE) which is well known to those skilled in the art. The first 32 layers of epitaxially grown material shown in FIG. 4 as layers 2-33 are alternating layers of undoped AlAs and GaAs with layer thicknesses of 83.5 nm (nanometers) and 70.0 nm respectively. Although all of the grown layers are represented in FIG. 4, only two layers are shown for layers 2-33 since the same two layers are repeated for 16 times thereby resulting in the 32 layers. This repetition is indicated in the figure by the designation of "X16" next to the layers. Similar repetitions for subsequently described layers are indicated in the same way. The next 12 layers, layers 34-45, are also alternating layers of AlAs and GaAs with layer thicknesses of 83.5 nm and 70.0 nm respectively, however these 12 layers are doped n-type. The next layer, layer 46, is also n-doped AlAs that is 83.5 nm thick and provides a zero phase shift on reflection. Layers 34-46 are n-doped with levels of about $2 \times 10^{18}$ cm$^{-3}$. These first 45 epitaxial layers 2-46 form the bottom reflector stack of both the SEL and the RCD. The next layer, layer 47, is n-doped Al$_x$Ga$_{1-x}$As with a doping level of about $1 \times 10^{18}$ cm$^{-3}$ and a thickness of 114.2 nm, where the aluminum mole fraction (x) is typically 35 percent. The 14 n-doped layers just described as layers 34-47 form the sub-collector region of the SEL structure. The next two layers, layers 48 and 49, are p-doped Al$_x$Ga$_{1-x}$As with doping levels of about $1 \times 10^{18}$ cm$^{-3}$ and $5 \times 10^{16}$ cm$^{-3}$ and thicknesses of 100.0 nm and 150.0 nm respectively where the aluminum mole fraction (x) is typically 35 percent. These two layers 48 and 49 form the collector region of the SEL which is not connected as an external terminal, the collector region of the RCD which is connected as an anode terminal, and the collector region of the HFET's which is connected as an outside terminal which in turn may be connected to a reference potential as described hereinabove. The next layer, layer 50, is undoped Al$_x$Ga$_{1-x}$As with a thickness of 180.0 nm, where the aluminum mole fraction (x) is typically 20 percent.

The next 6 layers, layers 51-56, are undoped alternating layers of GaAs and In$_y$Ga$_{1-y}$As with thicknesses of 10.0 nm and 9.0 nm respectively, where the indium mole fraction (y) is typically 15 percent. The 3 In$_y$Ga$_{1-y}$As layers provide the quantum wells which form the lasing region of the SEL, the absorbing region of the RCD, and the conducting channel of the HFET. On top of the uppermost quantum well provided by layer 56, a layer 57 of n$^+$ doped Al$_x$Ga$_{1-x}$As is grown with a n-type doping level of about $6 \times 10^{18}$ cm$^{-3}$ and thickness of 8.0 nm, where the aluminum mole fraction (x) is typically 20 percent. This layer 57 forms a charge sheet which creates an inversion channel in the uppermost quantum well. This inversion channel is identical in principle to the one formed in the double heterostructure optoelectronic switch disclosed in U.S. Pat. No. 4,806,997 entitled "Double Heterostructure Optoelectronic Switch" and issued to J. G. Simmons and G. W. Taylor Feb. 21, 1989, and in U.S. Pat. No. 4,800,415, entitled "Bipolar Inversion Channel Device" and issued Jan. 24, 1989 to J. G. Simmons and G. W. Taylor, both of which patents are hereby incorporated by reference. The inversion channel forms the source region of the SEL for which it is connected as an external source terminal, the source region of the RCD for which it provides a terminal shown as a cathode in FIG. 1, and as source and drain regions for the HFET's. Naturally for the HFET, separate electrical terminals are used for the source and drain, and these terminals are located at geographically separated points of layer 57.

Above charge sheet layer 57, two p-doped layers 58 and 59 of Al$_x$Ga$_{1-x}$As are grown with doping levels of about $1 \times 10^{17}$ cm$^{-3}$ and $5 \times 10^{17}$ cm$^{-3}$ and with thicknesses of 100.0 nm and 156.0 nm respectively, where the aluminum mole fractions (x) are 20 percent and 35 percent respectively. Then the next 48 layers, layers 60-107, are p-doped alternating layers of AlAs, Al$_x$Ga$_{1-x}$As, GaAs, and Al$_x$Ga$_{1-x}$As with p doping levels of about $2 \times 10^{18}$ cm$^{-3}$ and layer thicknesses of 68.5 nm, 15.0 nm, 57.5 nm, and 15.0 nm respectively. The aluminum mole fraction within the odd numbered Al$_x$Ga$_{1-x}$As layers is typically 60 percent. These 48 layers 60-107 form the top reflecting stack of both the SEL and RCD. The use of 4 repeating layers (as opposed to two in the bottom stack) is to reduce the electrical resistance of these layers. The top layer, layer 108, is a GaAs p$^+$ doped layer grown with a thickness of 47.0 nm and doping levels of about $2 \times 10^{19}$ cm$^{-3}$ used to facilitate ohmic contact to the structure. The top 51 layers 58-108, which are all p-doped, form the emitter region of the SEL as well as the gate region of both the RCD and the HFET.

Precise layer thicknesses are necessary to control the mode position of the Fabry-Perot cavity formed by the two grown mirror stacks. The lasing wavelength of the SEL as well as the absorbing wavelength of the RCD are determined by the energy band of the 3 In$_y$Ga$_{1-y}$As quantum wells. The wavelength (0.985 micrometers in free space for the embodiment disclosed) then defines the required thickness in the alternating mirrors, which must have a half-wavelength thickness for each repeated layer sequence. The layers between the two mirror stacks (layers 47 through 59) must also have a total thickness that is an integer number of a half wavelengths, and the quantum wells must be placed in an anti-node of the standing wave formed between the two mirrors. Placement of the quantum wells at an anti-node optimizes the electric field strength of the standing wave in the quantum wells. The use of common material layers for differently named contacts on the three devices is done to better illustrate the specific use of each contact on the three devices. In the implementation of the inversion channel (2,2,2) node of FIG. 1, the devices are formed by photolithographic definition on separate regions on the same wafer.

After the MBE growth process, the (2,2,2) node is realized through a number of processing steps, which in the end form the SEL's, RCD's, HFET's and the necessary electrical interconnects. The first step is to metalize the surface of the wafer using a refractory metal. A photolithographic mask is then used to define the circular emitter contact of the SEL, an annular (ring) gate of the RCD, and the gate contact of the HFET. The refractory metal is then used as a mask to allow the etching of the layers down to within about 150.0 nm of the $n^+$ charge sheet. This etching is done using a combination of reactive ion etching employing $CCl_2F_2:He(1:1)$ and wet chemical etching $H_3PO_4:H_2O:H_2O(1:8:120)$. For the SEL this mask leaves a circular post covered with the refractory metal. There is no top opening in the SEL since the generated light is emitted through the bottom stack and out through the transparent substrate. For the RCD this mask leaves a circular post with a ring of refractory metal on top that allows light incident perpendicular to the top surface of the wafer to enter the resonant cavity. For the HFET this mask leaves standard gates covered with refractory metal. The source region of the SEL and the RCD as well as the source and drain regions of the HFET are formed by ion-implanting the structure, such as by using $Si^+$ ions, and then flash annealing the structure at 950° C. for 10 seconds. It should be noted that the heavily doped source drain regions are self-aligned with the refractory metal.

Next a photolithographic mask is used to allow the SEL to be etched down to the n-type sub-collector region after which another mask is used such that both the n-type source and drain regions along with the sub-collector region on the SEL are metalized using AuGe/Ni/Au. The sample is the annealed at 450° C. for 12 seconds to activate the n-type contact. Note that the sub-collector region is not accessed for the RCD or the HFET. Next a photolithographic mask is used to allow the RCD and the HFET to be etched to the p-type collector region after which another mask is used to metalize the collector regions with Au/Zn. The sample is again annealed at 450° C. for 12 seconds to activate the p type contact.

In the HFET, the collector region acts as a back-gate contact to allow threshold adjustment, or when tied to the source provides a ground plane. In the RCD, the source and collector regions privide the p-n junction used to remove the photo current generated by the absorption of incident light. The annular gate of the RCD can be biased to reduce the responsiveness of the source-collector diode (by the removal of photogenerated holes) in order to match the responsiveness of two or more RCD's on the wafer. Another mask is used to cover the devices to allow an isolating implant of $H^+$ ions, which electrically isolates the devices. Next a mask is used to pattern Au to form the interconnects between the devices as shown in FIG. 1, and the sample is passivated and planarized using a spin coating of polyimide cured by heat treatment. A mask is used to open holes in the polyimide and Au pads are patterned over the openings to allow external electrical contact to the (2,2,2) node.

What is claimed is:

1. In an optoelectronic switching array, the combination comprising an inversion channel laser having emitter, sub-collector and source terminals, power source means for coupling an operating potential between said emitter and sub-collector terminals of said inversion channel laser, a photodetector having a first terminal connected to a reference potential and a second terminal which provides a current when light impinges on said photodetector, means for coupling the current generated by said photodetector to the source terminal of said inversion channel laser, and an impedance means coupled to said source terminal for absorbing a portion of the current from said photodetector whereby a shut-off current is drawn from said source terminal when said photodetector is not generating current due to impinging light.

2. The combination as defined in claim 1 wherein said impedance means includes a heterojunction field effect transistor having source, drain and gate terminals, and said gate terminal is directly coupled to said source terminal of said transistor thereby providing a two terminal impedance between the source and drain terminals of said transistor.

3. The combination as defined in claim 1 wherein said means for coupling the current generated by said photodetector includes a heterojunction field effect transistor having source, drain and gate terminals, and the combination further includes means for connecting an external control signal to said gate terminal.

4. The combination as defined in claim 1 wherein said power source means includes a heterojunction field effect transistor having source, drain and gate terminals, and said gate terminal is directly coupled to said source terminal of said transistor thereby providing a two terminal impedance between the source and drain terminals of said transistor.

5. An optoelectronic switching node wherein at least two input optical beams can be regenerated in either one of two different spatial locations in response to input control signals, said switching node comprising a first inversion channel photodetector positioned such that the photodetector develops a current in response to one of said input optical beams, a second inversion channel photodetector positioned such that it develops a current in response to the other one of said input optical beams, first and second inversion channel lasers each having emitter, sub-collector and source terminals, means for coupling an operating potential between the emitter and sub-collector terminals of said first and second inversion channel lasers, means responsive to said input control signals for selectively coupling the currents generated by said first and second photodetectors to the source terminals of said first and second inversion channel lasers, a first impedance means connected between the source terminal of said first inversion channel laser and a potential source, and a second impedance means connected between the source terminal of said second inversion laser and a potential source, whereby said first and second lasers are turned off when they are no longer receiving a current from said photodetectors.

6. An optoelectronic switching node as defined in claim 5 wherein said first and second impedance means each include a heterojunction field effect transistor having source, drain and gate terminals, said source and gate terminals being directly connected together.

7. An optoelectronic switching node as defined in claim 5 wherein said means for selectively coupling currents generated by said first and second photodetectors include a heterojunction field effect transistor having source, drain and gate terminals, the source terminal of said transistor being connected to receive the current from one of said photodetectors, the drain terminal of said transistor being connected to the source terminal of one of said lasers, and the gate terminal being connected so as to receive one of said input control signals.

8. An optoelectronic switching node as defined in claim 5 wherein said means for coupling an operating potential between the emitter and sub-collector terminals of said first and second inversion channel lasers includes a heterojunction field effect transistor having source, drain and gate terminals, the source and gate terminals of said transistor being connected together, and said drain terminal of said transistor being connected to the sub-collector terminal of one of said inversion channel lasers.

9. An optoelectronic switching node as defined in claim 5 wherein said means for selectively coupling currents generated by said first and second photodetectors includes first, second, third and fourth heterojunction field effect transistors each one of which has a source, drain and gate terminal, the source terminals of said first and second transistors being connected to receive the current developed by said first inversion channel photodetector, the source terminals of said third and fourth transistors being connected to receive the current developed by said second inversion channel photodetector, the drain terminals of said first and third transistors being connected to the source terminal of said first inversion channel laser, the drain terminals of said second and fourth transistors being connected to the source terminal of said second inversion channel laser, and the gate terminals of said first, second, third and fourth transistors are connected to receive said input control signals.

10. An optoelectronic switching node as defined in claim 9 wherein said first impedance means includes a fifth heterojunction field effect transistor having a source, drain and gate terminal, the source and gate terminals of said fifth transistor being connected to the source terminal of said first inversion channel laser, the drain terminal of said fifth transistor being connected to said potential source, said second impedance means includes a sixth heterojunction field effect transistor having a source, drain and gate terminals, the source and gate terminals of said sixth transistor being connected to the source terminal of said second inversion channel laser, and the drain terminal of said sixth transistor being connected to said potential source.

* * * * *